United States Patent
Nakashima

(10) Patent No.: US 8,438,406 B2
(45) Date of Patent: *May 7, 2013

(54) SEMICONDUCTOR INTEGRATED CIRCUIT FOR MINIMIZING A DEVIATION OF AN INTERNAL POWER SUPPLY FROM A DESIRED VALUE

(75) Inventor: Shingo Nakashima, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/317,847

(22) Filed: Oct. 31, 2011

(65) Prior Publication Data

US 2012/0119826 A1  May 17, 2012

Related U.S. Application Data

(63) Continuation of application No. 11/598,038, filed on Nov. 13, 2006, now Pat. No. 8,065,535.

(30) Foreign Application Priority Data

Nov. 14, 2005  (JP) .................. 2005-328519

(51) Int. Cl.
*G06F 1/00* (2006.01)
*G06F 11/30* (2006.01)
*G05F 3/02* (2006.01)

(52) U.S. Cl.
USPC ............ 713/300; 713/340; 327/541

(58) Field of Classification Search ............ 713/300
See application file for complete search history.

(56) References Cited

U.S. PATENT DOCUMENTS

| | | | |
|---|---|---|---|
| 5,249,155 A | 9/1993 | Arimoto et al. | |
| 5,917,765 A | 6/1999 | Morishita et al. | |
| 6,140,862 A * | 10/2000 | Hagura | 327/537 |
| 6,351,179 B1 * | 2/2002 | Ikehashi et al. | 327/541 |
| 6,737,910 B2 * | 5/2004 | Kitagawa et al. | 327/541 |
| 7,002,872 B2 * | 2/2006 | Hwang et al. | 365/230.03 |
| 7,102,935 B2 | 9/2006 | Miki et al. | |

FOREIGN PATENT DOCUMENTS

| | | |
|---|---|---|
| JP | 2003-243538 | 8/2003 |
| JP | 2004-22647 | 1/2004 |

* cited by examiner

*Primary Examiner* — Suresh Suryawanshi
(74) *Attorney, Agent, or Firm* — McGinn IP Law Group, PLLC

(57) ABSTRACT

A semiconductor integrated circuit includes first and second external terminals receiving an external power supply voltage, an internal power supply line coupling to the first and second external terminals, a first transistor coupling between the first external terminal and the internal power supply line, a second transistor that is coupled between the second external terminal and the internal power supply line, a first monitor line coupling to a first node of the internal power supply line, a second monitor line coupling to a second node of the internal power supply line, the second node being different from the first node, and a controller coupling to the first and second monitor lines, the controller outputs a control signal corresponding to potentials of the first and second monitor lines to the first and second transistors.

22 Claims, 6 Drawing Sheets

SEMICONDUCTOR INTEGRATED CIRCUIT FOR MINIMIZING A DEVIATION OF AN INTERNAL POWER SUPPLY FROM A DESIRED VALUE

The present application is a Continuation Application of U.S. patent application Ser. No. 11/598,038 filed on Nov. 13, 2006, now U.S. Pat. No. 8,065,535 which is based on Japanese Patent Application No. 2005-328519, filed on Nov. 14, 2005, the entire contents of which is incorporated herein by reference.

BACKGROUND OF THE INVENTION

1. Field of the Invention

The present invention relates to a semiconductor integrated circuit, and particularly to a circuit having a regulator.

2. Description of Related Art

In recent years, operating voltage has been decreasing with miniaturization of devices. On the other hand, electrical power consumption is increasing due to an increase in circuit size and faster circuit speed. In such a semiconductor integrated circuit, an internal power supply voltage is generated from an external power supply voltage. The internal voltage is supplied to the internal circuit.

For such a technique, techniques disclosed in Japanese Unexamined Patent Application Publication No. 2004-22647 and Japanese Unexamined Patent Application Publication No. 2003-243538 are known. In the techniques, a plurality of MOS transistors are connected between a line for transmitting an external power supply voltage and a line for supplying an internal power supply voltage. A reference potential generated by a control circuit is supplied to gates of the plurality of MOS transistors. The reference, potential is changed so as to adjust the internal power supply voltage to a specified internal power supply voltage.

In a conventional technique, a standard potential is created by a control circuit monitoring a dummy circuit or monitoring an internal voltage output by a MOS transistor. With such configuration, it is often difficult to adjust an entire internal power supply voltage to a desired value with a fluctuation in the dummy circuit to monitor or the voltage point to monitor.

Thus a conventional technique has no consideration over a spot to monitor the internal power supply voltage. Accordingly it has now been discovered that it is often difficult to adjust the internal power supply voltage close to a desired value.

SUMMARY OF THE INVENTION

According to an aspect of the present invention, there is provided a semiconductor integrated circuit that includes an external terminal input with an external power supply voltage, a plurality of field effect transistors connected between the external terminal and an internal power supply line, and a control circuit input with potentials of spots voltage drops from output points are substantially the same in the plurality of field effect transistors of the internal power supply line, for controlling the plurality of field effect transistors according to the potential being input.

According to another aspect of the present invention, there is provided a semiconductor integrated circuit that includes an external terminal applied with an external power supply voltage, a plurality of field effect transistors each connected between the external terminal and a plurality of internal power supply lines, a monitor line connected with the plurality of internal power supply transistors, and a control circuit input with a potential of a node between the plurality of internal power lines and the monitor line through the monitor line, for outputting a voltage for controlling the plurality of field effect transistors according to the potential of the node being input. Further, a potential different between a potential of output points of the plurality of field effect transistors and the potential of the node are substantially the same.

With the abovementioned configuration, it is possible to adjust the internal power supply voltage close to a desired value.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
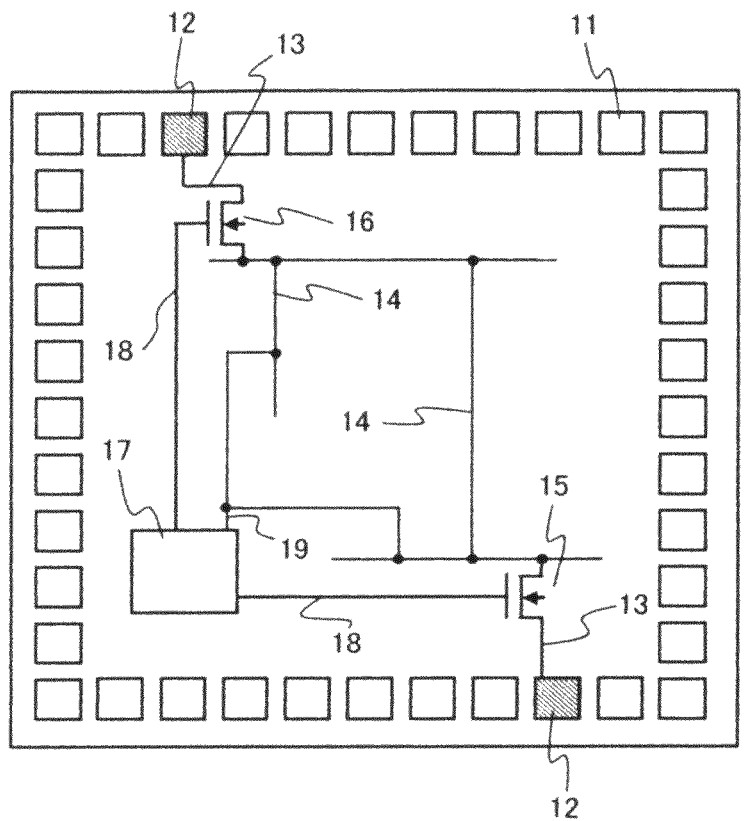
FIG. 1 is a view showing a layout of a first embodiment.
Figure 2:
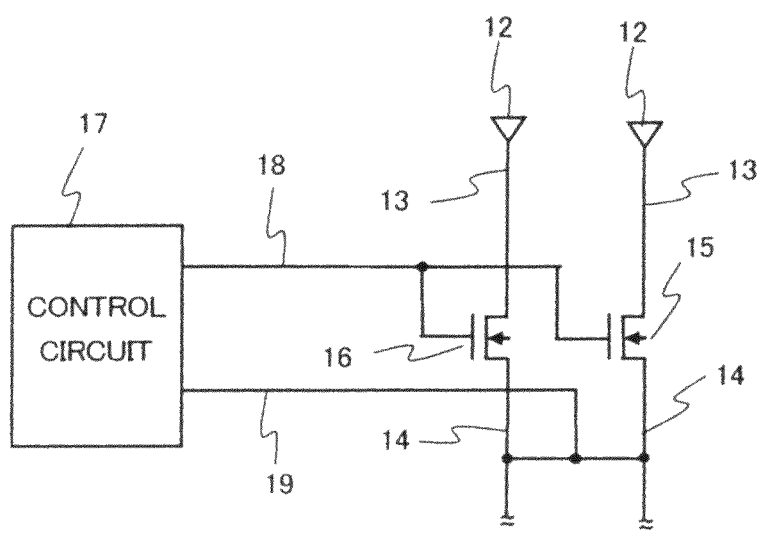
FIG. 2 is a circuit view showing a configuration of the first embodiment.

An embodiment of the present invention is described hereinafter in detail with reference to the drawings. FIG. 1 is a layout view showing an example of a circuit layout according to a first embodiment of the present invention. FIG. 2 is a circuit view schematically showing a circuit according to the present invention. In FIG. 2, components identical to those in FIG. 1 are denoted by reference numerals identical to those therein.

As shown in FIGS. 1 and 2, a semiconductor integrated circuit of the first embodiment includes external terminals 11 and 12, a first power supply voltage line 13, a second power supply voltage line 14, a plurality of NMOS transistors 15 and 16, a control circuit 17, a standard voltage supply line 18, and a monitor line 19.

As shown in FIG. 1, the external terminals are arranged in periphery of a chip which an integrated circuit is formed therein.

Figure 8:
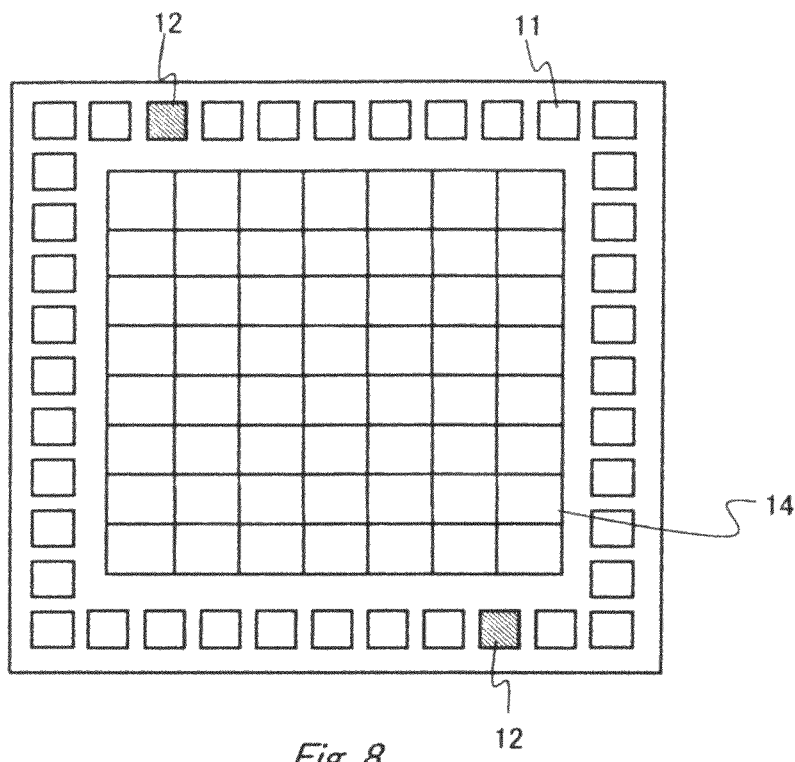
FIG. 8 is a view showing an example of configuration of meshed power supply line.

The external terminals includes a signal input terminal 11 and a power supply input terminal 12 etc. In this embodiment, an external power supply voltage is input from the plurality of external terminals (power supply input terminals) 12. A first power supply voltage line 13 (hereinafter referred to as an external power supply line) is a line for transmitting an external power supply voltage in an integrated circuit. A second power supply voltage line 14 (hereinafter referred to as an internal power supply line) is a line for supplying an internal power supply voltage to an internal circuit. FIG. 1 is a schematic view showing a connection relationship of the present invention. The internal power supply line 14 is formed by a power supply mesh shown in FIG. 8, one large sized wiring of one layer shown in FIG. 9, or a multilayer wiring.

The plurality of NMOS transistors 15 and 16 have their drains connected to the external power supply line 13 and sources connected to the internal power supply line 14. The NMOS transistors correspond to output transistors for outputting the internal power supply voltage. The control circuit 17 is a circuit for monitoring the internal power supply voltage and generating a standard voltage. The internal power supply voltage is output based on the standard voltage output from the control circuit 17. The standard voltage supply line 18 supplies the standard voltage to gates of the plurality of NMOS transistors. The monitor line 19 inputs voltages of specified spots of the internal power supply line to the control circuit 17. The internal power supply voltage is monitored through this monitor line.

In this embodiment as formed above, the external power supply voltage is supplied from the external terminal (power supply input terminal) 12 and transmitted in the integrated circuit by the external power supply line 13. In the integrated circuit, the plurality of NMOS transistors 15 and 16 output the internal power supply voltage based on the standard voltage so as to supply the internal power supply voltage to the internal power supply line 14. The internal power supply line 14 supplies the internal power supply voltage to the internal circuit. The internal power supply voltage is monitored by the control circuit 17 through the monitor line 19. The control circuit 17 generates the standard voltage based on the voltage it monitored and supplies the standard voltage to gate of each transistor via the reference voltage line 18.

Figure 3:
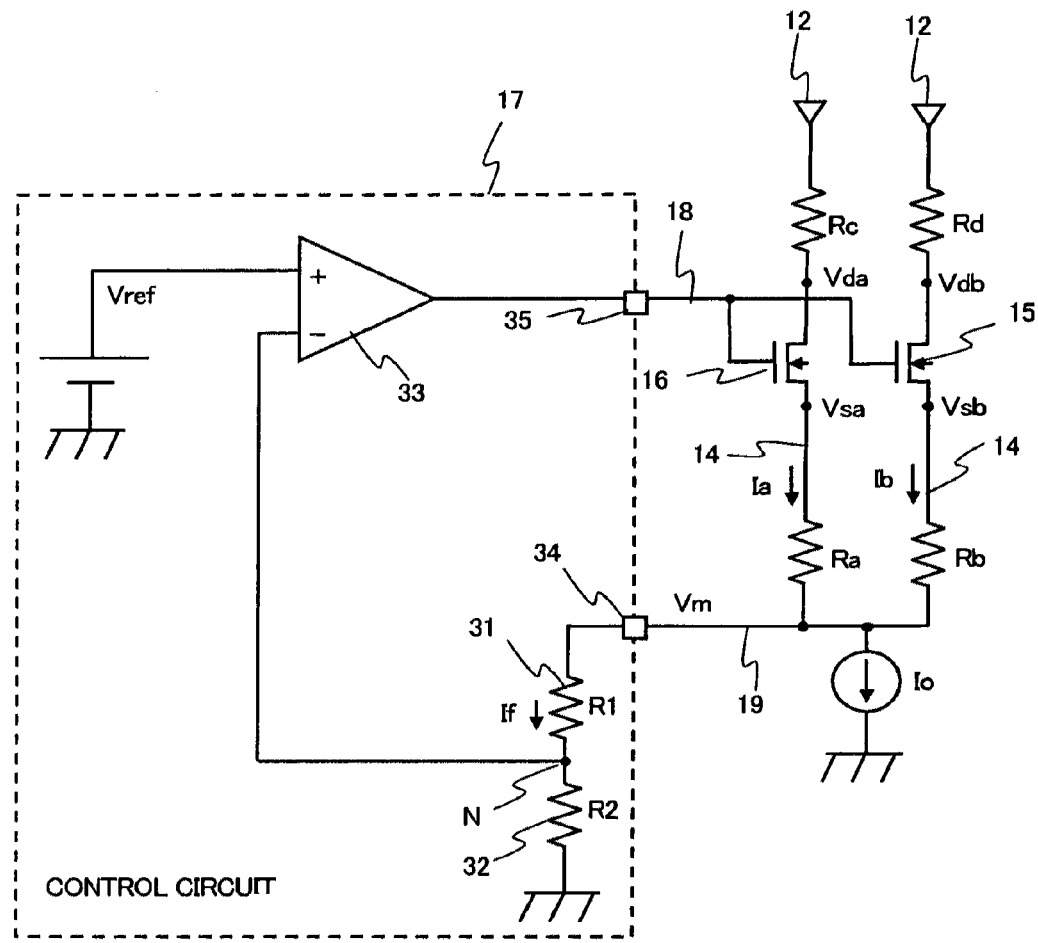
FIG. 3 is a circuit view showing a detailed configuration of the first embodiment.

FIG. 3 is a view showing the circuit of FIG. 2 in more detail in view of the control circuit 17 and wiring resistance. A configuration and a control operation of the control circuit 17 according to this embodiment are described hereinafter in detail with reference to FIG. 3. In FIG. 3, components identical to those in FIGS. 1 and 2 are denoted by reference numerals identical to those therein with detailed description omitted.

As shown in FIG. 3, the control circuit 17 includes resistances 31 and 32, and a differential amplifier 33. The resistances 31 and 32 are connected in series between a monitor input terminal 34 and a ground potential. A voltage of the node N between the resistances 31 and 32 is connected to an inverted input terminal of the differential amplifier. The reference voltage Vref is input to a non-inverted input terminal of the differential amplifier 33. The differential amplifier 33 inputs a voltage based on a difference between the voltages input to the inverted and the non-inverted input terminals. The voltage output from the differential amplifier is output from a standard voltage output end 35 as a standard voltage.

In this embodiment, voltages of a plurality of spots in which voltage drops from the NMOS transistors (output transistors) are the same in the internal circuit is input to the control circuit 17 through the monitor line 19.

A relationship between the control circuit and a voltage of this embodiment is described hereinafter in detail. In the explanation below, a wiring resistance from the power supply input terminal 12 to the transistor 16 is referred to as Rc, a wiring resistance to the transistor 15 is referred to as Rd, a wiring resistance from the transistor 16 to the monitor line 19 is referred to as Ra, and a wiring resistance from the transistor 15 to the monitor line 19 is referred to as Rb. A source voltage of the transistor 16 is referred to as Vsa and a drain voltage of the transistor 16 is referred to as Vda. A source voltage of the transistor 15 is referred to as Vsb and a drain voltage of the transistor 15 is referred to as Vdb. A voltage of the monitor line is referred to as Vm. In FIG. 3, a current flowing to the transistor 16 side is referred to as Ia and a current flowing to the transistor 15 side is referred to as Ib. Further, a load current combining Ia and Ib is referred to as Io.

In the circuit of FIG. 3, a voltage of a node N is configured to be the same as the reference voltage Vref. Therefore the voltage of monitor line Vm can be calculated as:

$$Vm=(Vref/R2)*(R1+R2)=Vref*[(R1/R2)+1] \quad (1)$$

wherein R1 and R2 are resistance values of the resistances 31 and 32.

Further, the source voltages of the transistors 15 and 16 can be calculated as:

$$Vsa=Vm+Ia*Ra=Vref*[(R1/R2)+1]+Ia*Ra \quad (2)$$

$$Vsb=Vm+Ib*Ib*Rb=Vref*[(R1/R2)+1]+Ib*Rb \quad (3)$$

Drain voltages of the transistors 15 and 16 can be calculated as:

$$Vda=VDDA-Ia*Rc \quad (4)$$

$$Vdb=VDDB-Ib*Rd \quad (5)$$

wherein VDDA is a voltage of the external terminals of the transistor 16 side, and VDDB is a voltage of external terminals of the transistor 15 side.

Further, the current If flowing to the resistances 31 and 32 can be calculated as:

$$If=Vm/(R1+R2) \quad (6)$$

In this embodiment, in order to maintain the internal power supply voltage to a specified value, basically the transistors needs to be operated in a saturation region. The external power supply voltages VDDA and VDDB that are required for the transistors to operate in the saturation region are:

$$VDDA>Vga-Vta+Ia*Ra \quad (7)$$

$$VDDB>Vgb-Vtb+Ib*Rb \quad (8)$$

wherein the gate voltage of the transistor 16 is Vga, a threshold is Vta, the gate voltage of the transistor 15 is Vgb, and a threshold is Vtb.

Voltages of each part of this embodiment are described hereinbefore. In this embodiment, output transistors are NMOS transistors. With NMOS transistors operating in a saturation region, a slight difference between the drain voltages Vda and Vdb has only a small influence to the current flowing the transistors. Thus a slight difference between Rc and Rd can be accepted. Potentials of Vsa and Vsb, and Ra and Rb relating to a voltage drop therefrom are considered hereinafter in detail.

In this embodiment, voltages of spots in which voltage drops from the NMOS transistors (output transistors) are the same is input to the control circuit through the monitor line 19. Thus with Ra=α*R, and Rb=(1−α)*R in the formulas (2) and (3), it can be expressed as:

$$Vm=Vsa-\alpha*R=Vsb-Ib*(1-\alpha)*R \quad (9)$$

From the formula (9), it can be expressed as:

$$Vsa-Vsb=\alpha*R(Ia+Ib)-Ib*R \quad (10)$$

The current values flowing the transistors operating in the saturation region can be calculated as:

$$Ia = Ka*(Vga-Vsa-Vta)^2 \quad (11)$$

$$Ib = Kb*(Vgb-Vsb-Vtb)^2 \quad (12)$$

Ka and Kb are constants based on size of the transistors. As the same voltage from the control circuit 17 is supplied to the gates of the transistors 15 and 16, it can be expressed that Vga=Vgb. Further, thresholds of the transistors are assumed to be the same, that is Vta=Vtb=Vt, then Vsa−Vsb=ΔVs. Therefore from the formula (12), it can be expressed as:

$$Ib = Kb*(Vga-Vsa-Vt+\Delta Vs)^2 \quad (13)$$

Further, with Vga−Vsa−Vt=A, from the formulas (10), (11), and (13), it can be expressed as:

$$\Delta Vs = \alpha*R*[Ka*A^2 + Kb*(A+\Delta Vs)^2] - R*[Kb*(A+\Delta Vs)^2] \quad (14)$$

Since Vsa and Vsb are adjusted to be equivalent as the internal power supply voltage, ΔVs=0. Thus it can be expressed as:

$$\alpha = Kb*A^2/(Ka*A^2 + Kb*A^2) \quad (15)$$

From the formula (15), by inputting the voltages of spots in which voltage drops from the transistors 15 and 16 become the same into the control circuit through the monitor line 19, the internal power supply voltage can be adjusted close to a desired value. In case the transistors 15 and 16 are the same transistors, the internal power supply voltage can be adjusted close to the desired value by setting α=0.5.

For a better understanding of this effect, specific numbers are applied to the formula. For example in the formula (10), Ia=Ib=0.1 (A) and R=1 (Ω), and α=0.9:

$$Vsa - Vsb = 0.9*1*(0.1+0.1) - 0.1*1 = 0.08 (V)$$

In this case, a difference is generated in potentials of Vsa and Vsb even with the transistors of the same size. Accordingly it is difficult to adjust the internal power supply voltage close to the desired value.

With α=0.5, it can be calculated as:

$$Vsa - Vsb = 0.5*1*(0.1+0.1) - 0.1*1 = 0.00 (V).$$

As described in the foregoing, the monitor line is input to the control circuit from spots where the voltage drops from the output transistors become the same, which is IaRa=IbRb. By the control circuit outputting the standard voltage to the plurality of transistors according to this input, it is possible to maintain the internal voltage to a value close to the desired value.

Second Embodiment

Figure 4:
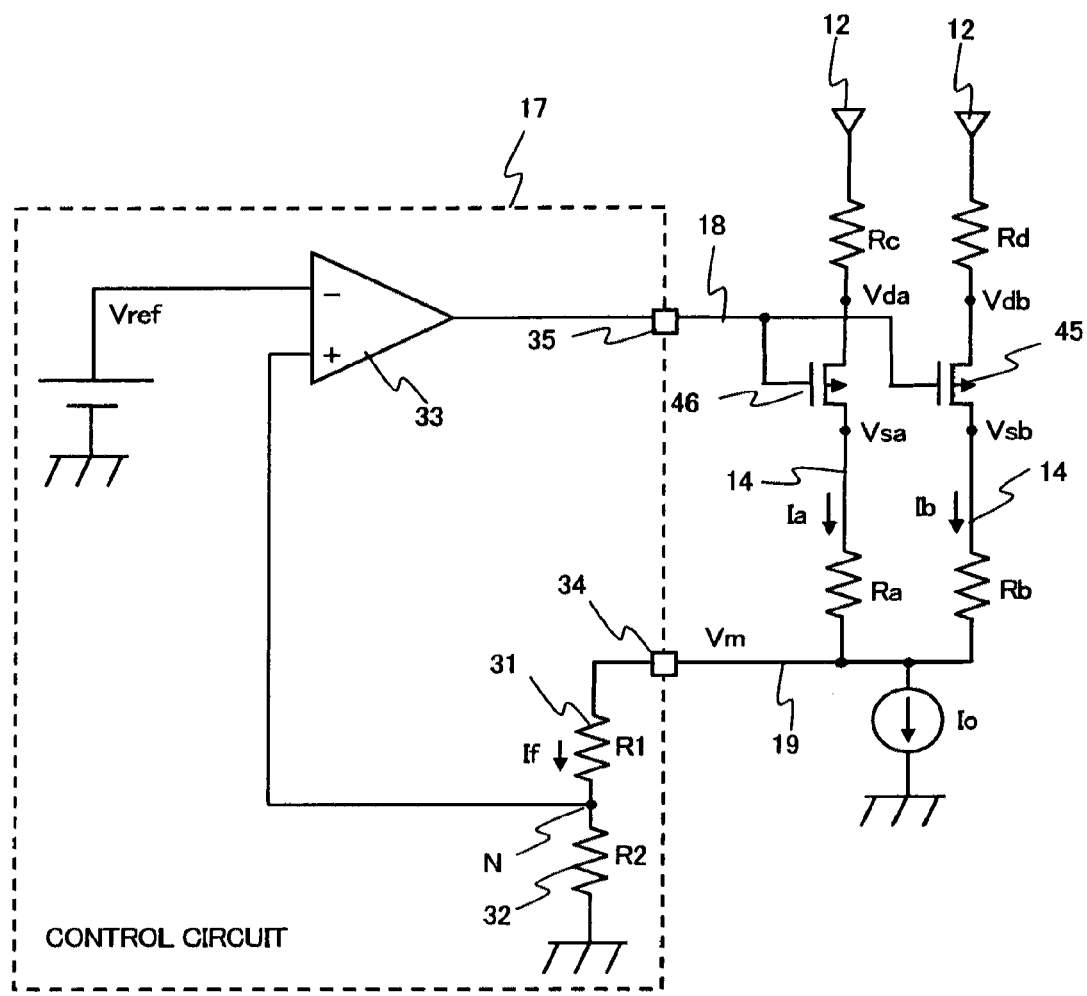
FIG. 4 is a circuit view showing a detailed configuration of a second embodiment.

FIG. 4 is a view showing a circuit of a second embodiment. In FIG. 4, components identical to those in FIGS. 1 to 3 are denoted by reference numerals identical to those therein with detailed description omitted. In the first embodiment, transistors outputting the internal power supply voltage from the external power supply voltage are NMOS transistors 15 and 16. In this embodiment, the transistors are formed by PMOS transistors 45 and 46. Further in this embodiment, the voltage of the node N between the resistances 31 and 32 is input to a non-inverted input terminal of the differential amplifier 33. The reference voltage Vref is input to the inverted input terminal of the differential amplifier 33.

Further in the first embodiment, NMOS transistors are used for the output transistors. Thus a slight difference between Vda and Vdb have only a small influence to the currents Ia and Ib. However with PMOS transistors being used for the output transistors, a difference is generated between Ia and Ib. Accordingly in this embodiment, Rc=Rd.

Forming the output transistors by the PMOS transistors 45 and 46 could reduce a minimum operating voltage more than a case of forming the output transistors by NMOS transistors.

Third Embodiment

Figure 5:
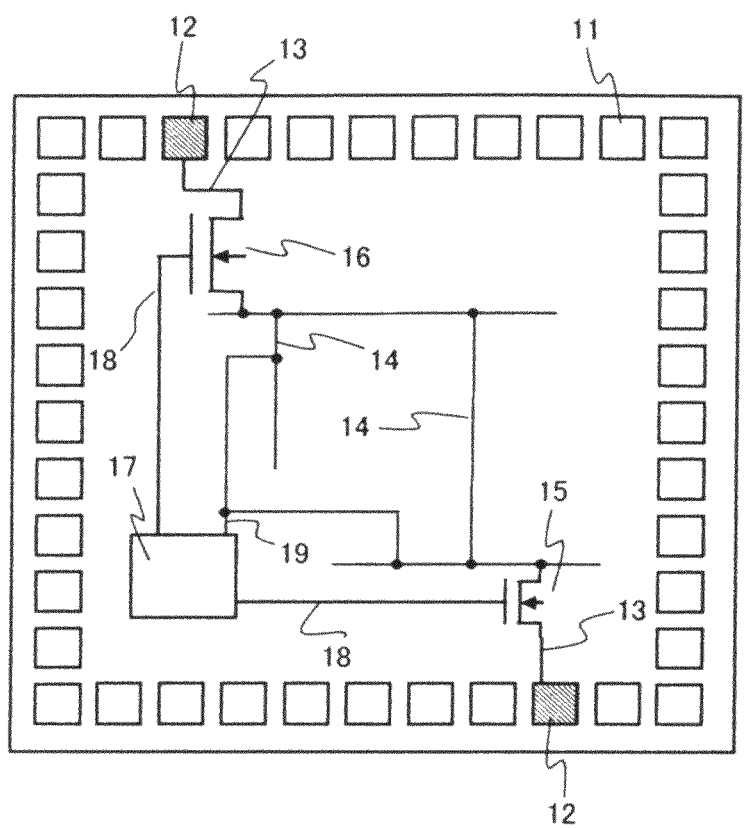
FIG. 5 is a view showing a layout of a third embodiment.

FIG. 5 is a layout configuration view showing an entire integrated circuit for explaining the third embodiment. A circuit diagram of the third embodiment is not illustrated because it is equivalent to FIG. 3. However, a case in which the same sized transistors cannot be formed for the transistors 15 and 16 of FIG. 3 due to a layout limitation is described in this embodiment. For example a case is described hereinafter in which the same current as the first embodiment needs to be supplied from the transistors to the internal circuit and size of the NMOS transistor 15 is half of the size of the NMOS transistor 15 in the first embodiment.

With different size of the transistors, Ka in the formula (11) is Ka', and Kb in the formula (12) is Kb'. With the size of the transistor 15 half the size of the first embodiment, a constant of the transistor using Kb of the first embodiment can be expressed as:

$$Kb' = 0.5Kb \quad (16)$$

The current same as the first embodiment needs to be supplied from the transistors to the internal circuit here. Specifically, since the transistors 15 and 16 are connected in parallel, total size of the transistors 15 and 16 needs to be the same as the first embodiment. This can be expressed as:

$$Ka + Kb = Ka' + Kb' \quad (17)$$

Since Ka=Kb, the same current as the first embodiment can be passed through with Ka'=1.5Ka, calculated from the formulas (16) and (17).

With Ka'1.5Ka and Kb'=0.5Kb, it can be calculated from the formula (15) that α=0.25. That is, by connecting the monitor line from spots in which a voltage drops Ia*0.25R from the NMOS transistor 16 and a spot in which a voltage drops Ib*0.75R from the NMOS transistor 15 to the control circuit, a deviation of the internal power supply from the desired value can be at minimum.

According to the third embodiment, it is possible to minimize the deviation from the desired value by monitoring the voltages of the spots in which the voltage drops from output transistors are the same even with the output transistors having different sizes. Furthermore the layout limitation can be eased.

Fourth Embodiment

Figure 6:
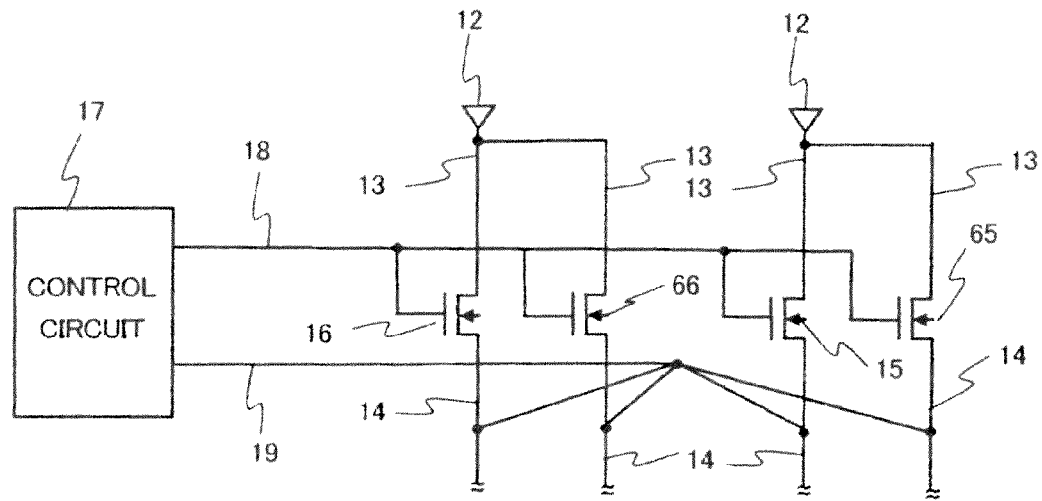
FIG. 6 is a circuit view showing a configuration of a fourth embodiment.
Figure 7:
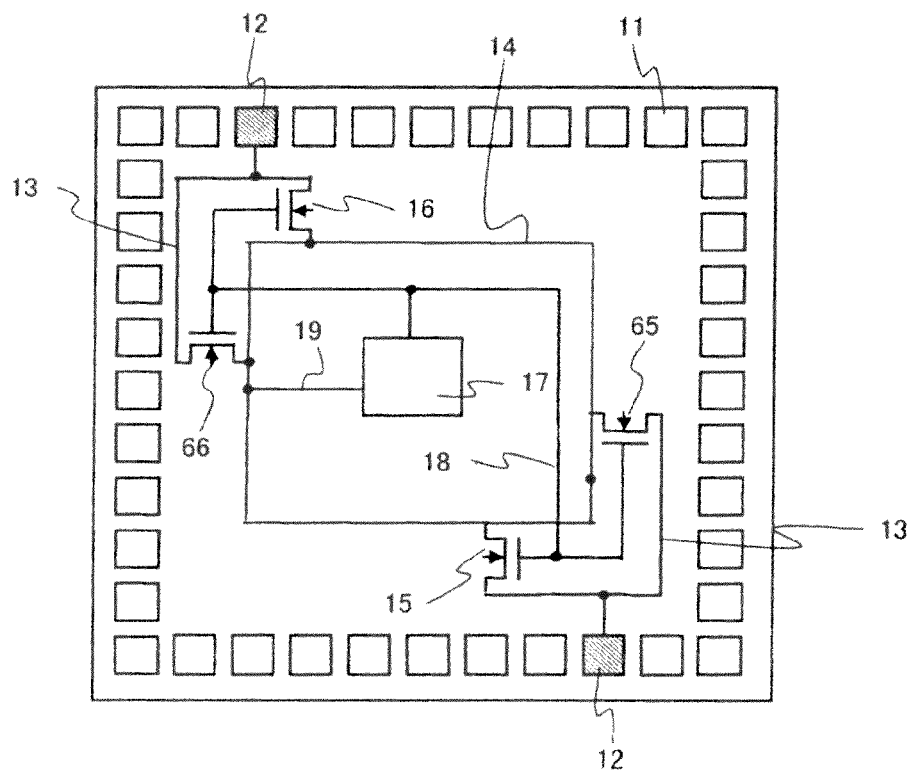
FIG. 7 is a view showing a layout of the fourth embodiment.

FIG. 6 is a circuit diagram of a fourth embodiment. FIG. 6 is a circuit including NMOS transistors 65 and 66 connected in parallel to the NMOS transistors 15 and 16 of FIG. 2. FIG. 7 is a view showing a layout formed as above.

This embodiment is characterized in including a plurality of output transistors connected to one power supply input terminal 12. This configuration eases the limitation for the number of output transistor terminals.

Figure 9:
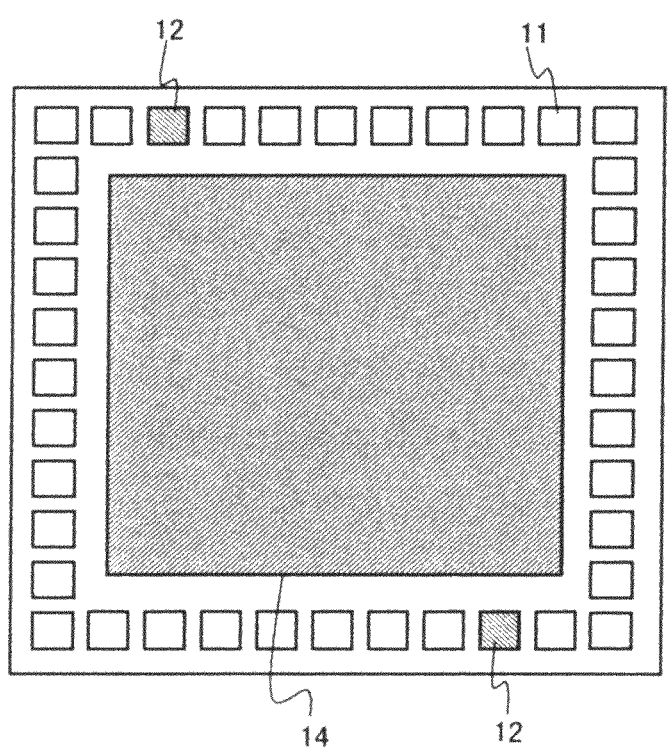
FIG. 9 is a view showing an example of configuration of one layer power supply line having a large area.

While the invention has been described in the context of a preferred embodiment, it will be apparent to those skilled in the art that the present invention may be modified. For example, by using one large area layer or a multilayer line for the power supply line as shown in FIG. 9, the wiring resistance can further be reduced.

It is apparent that the present invention is not limited to the above embodiment and it may be modified and changed without departing from the scope and spirit of the invention.

What is claimed is:

1. A semiconductor integrated circuit comprising:
   first and second external terminals that receive an external power supply voltage;
   an internal power supply line that is coupled to the first and second external terminals;
   a first transistor that is coupled between the first external terminal and the internal power supply line;
   a second transistor that is coupled between the second external terminal and the internal power supply line;
   a first monitor line that is coupled to a first node of the internal power supply line;
   a second monitor line that is coupled to a second node of the internal power supply line, the second node being different from the first node; and
   a controller that is coupled to the first and second monitor lines, the controller outputting a control signal corresponding to potentials of the first and second monitor lines to the first and second transistors,
   wherein, in a plane including the first external terminal, the second external terminal and the controller, the controller is formed on a perpendicular bisector of an imaginary line connecting the first external terminal with the second external terminal.

2. The semiconductor integrated circuit according to claim 1, wherein the controller comprises a differential amplifier that inputs the potentials of the first and second monitor lines to generate the control signal.

3. The semiconductor integrated circuit according to claim 1, wherein the controller comprises a resistance that is coupled to the first and second monitor lines, and generates the control signal corresponding to the potentials of the first and second monitor lines divided by the resistance.

4. The semiconductor integrated circuit according to claim 1, wherein the controller comprises a reference voltage generator that generates a reference voltage, and generates the control signal in response to the reference voltage and the potentials of the first and second monitor lines.

5. The semiconductor integrated circuit according to claim 1, wherein an input of the controller has potentials of spots where voltage drops from output points of the first and second transistors are substantially the same in the internal power supply line.

6. The semiconductor integrated circuit according to claim 1, wherein values of wiring resistances of the internal power supply line between a spot of the internal power supply line, which are connected to the controller and output points of the first and second transistors are substantially the same with each other.

7. The semiconductor integrated circuit according to claim 1, wherein:
   the first transistor comprises a first current flowing therein,
   the second transistor comprises a second current flowing therein, and
   a value multiplying a resistance value of the internal power supply from output points of the first transistor to spots with a value of the first current is substantially the same as a value multiplying a resistance value of the internal power supply line from output points of the second transistor to spots with a value of the second current.

8. The semiconductor integrated circuit according to claim 1, wherein the controller compares potentials of spots where voltage drops from output points of the first and second transistors are substantially the same with a reference potential, and outputs a voltage for controlling the first and second transistors according to a result of the comparison.

9. The semiconductor integrated circuit according to claim 1, wherein the first and second external terminals are symmetrically arranged in relation to the controller.

10. The semiconductor integrated circuit according to claim 1, wherein the first and second monitor lines are input to the controller from spots where a voltage drop from the first and second transistors, respectively, become the same.

11. The semiconductor integrated circuit according to claim 1, wherein, the controller is formed substantially equidistant from the first external terminal and the second external terminal.

12. The semiconductor integrated circuit according to claim 1, wherein, in the plane including the first external terminal, the second external terminal and the controller, the controller is formed on a perpendicular bisector of an imaginary line connecting the first external terminal with the second external terminal.

13. The semiconductor integrated circuit according to claim 1, wherein the first and second monitor lines are the same distance from the controller to the first and second transistors, respectively.

14. The semiconductor integrated circuit according to claim 1, wherein the controller comprises an amplifier that inputs the potentials of the first and second monitor lines to generate the control signal.

15. The semiconductor integrated circuit according to claim 1, wherein the controller comprises a resistance coupled to the first and second monitor lines, and generates the control signal related to the potentials of the first and second monitor lines and the resistance.

16. The semiconductor integrated circuit according to claim 1, wherein the controller generates a control signal in response to a reference voltage and the potentials of the first and second monitor lines, and
   wherein an input of the controller has potentials of spots where voltage drops from output points of the first and second transistors are substantially the same in the internal power supply line.

17. The semiconductor integrated circuit according to claim 1, wherein the controller generates a standard voltage based on a voltage monitored on the first and second monitoring lines and supplies the standard voltage to a gate of both the first and second transistors to control the first and second transistors, and
   wherein the controller receives power from the first and second external terminals via the first and second transistors, respectively.

18. The semiconductor integrated circuit according to claim 1, wherein the controller is configured to connect with the first external terminal and the second external terminal, such that where a voltage drop from the first transistor is a same as a voltage drop from the second transistor, is input into the controller through the first and second monitoring lines.

19. The semiconductor integrated circuit according to claim 1, wherein the controller is formed connecting with the first external terminal and the second external terminal, where a voltage drop from the first transistor into the controller through the first monitoring line becomes a same as a voltage drop from the second transistor through the second monitoring line.

20. A semiconductor integrated circuit comprising:
   first and second external terminals that receive an external power supply voltage formed on a periphery of a chip;
   an internal power supply line that is coupled to the first and second external terminals;

a first transistor that is coupled between the first external terminal and the internal power supply line;

a second transistor that is coupled between the second external terminal and the internal power supply line;

a first monitor line that is coupled to a first node of the internal power supply line;

a second monitor line that is coupled to a second node of the internal power supply line, the second node being different from the first node; and a controller that is coupled to the first and second monitor lines, the controller outputting a control signal corresponding to potentials of the first and second monitor lines to the first and second transistors, wherein the controller is laid out on the chip with respect to the first external terminal and the second external terminal, such that a voltage drop from the first transistor is substantially a same as a voltage drop from the second transistor, is input into the controller through the first and second monitoring lines.

21. The semiconductor integrated circuit according to claim 19, wherein the controller is laid out on the chip with respect to the first external terminal and the second external terminal, such that a voltage drop from the first external terminal to the controller via the first transistor and the first monitor line is substantially a same as a voltage drop from the second external terminal to the controller via the second transistor and the second monitoring line.

22. The semiconductor integrated circuit according to claim 1, wherein the perpendicular bisector of the imaginary line comprises a straight line that connects the first external terminal with the second external terminal.

* * * * *